United States Patent
Natsuaki et al.

(10) Patent No.: US 10,354,416 B2
(45) Date of Patent: Jul. 16, 2019

(54) NON-CONTRAST MR ANGIOGRAPHY WITH VARIABLE SLICE RESOLUTION 3D TIME-OF-FLIGHT

(71) Applicant: Siemens Healthcare GmbH, Erlangen (DE)

(72) Inventors: Yutaka Natsuaki, Riverside, CA (US); Xiaoming Bi, Oak Park, CA (US); Gerhard Laub, San Mateo, CA (US)

(73) Assignee: Siemens Healthcare GmbH, Erlangen (DE)

( * ) Notice: Subject to any disclaimer, the term of this patent is extended or adjusted under 35 U.S.C. 154(b) by 71 days.

(21) Appl. No.: 15/152,586

(22) Filed: May 12, 2016

(65) Prior Publication Data
US 2017/0330353 A1 Nov. 16, 2017

(51) Int. Cl.
*G06T 7/11* (2017.01)
*G06T 11/00* (2006.01)

(52) U.S. Cl.
CPC ............. *G06T 11/003* (2013.01); *G06T 7/11* (2017.01); *G06T 2207/10088* (2013.01); *G06T 2207/30101* (2013.01)

(58) Field of Classification Search
None
See application file for complete search history.

(56) References Cited

U.S. PATENT DOCUMENTS

| 4,953,087 A * | 8/1990 | Crawford | G01R 33/56 345/419 |
| 6,556,856 B1 * | 4/2003 | Mistretta | G01R 33/5635 324/306 |
| 2008/0103386 A1 * | 5/2008 | Kirsch | G01R 33/5635 600/420 |
| 2009/0010513 A1 * | 1/2009 | Kirsch | G01R 33/5601 382/130 |

OTHER PUBLICATIONS

Lustig, Michael, David Donoho, and John M. Pauly. "Sparse MRI: The application of compressed sensing for rapid MR imaging." Magnetic resonance in medicine 58.6 (2007): 1182-1195.*

(Continued)

*Primary Examiner* — Vu Le
*Assistant Examiner* — Tracy Mangialaschi

(57) ABSTRACT

A method for acquiring an image volume using a magnetic resonance imaging device includes performing an acquisition process to acquire a first dataset corresponding to a first portion of an anatomical region of interest at a first slice resolution, wherein the first dataset comprises a first plurality of three-dimensional slabs or a first plurality of two-dimensional slice regions. Additionally, one or more additional acquisition processes is performed to acquire a second dataset corresponding to a second portion of the anatomical region of interest at a second slice resolution that is lower or higher than the first slice resolution, wherein the second dataset comprises a second plurality of three-dimensional slabs or a second plurality of two-dimensional slice regions. Once the datasets are acquired, a reconstruction process is applied to jointly reconstruct the first dataset and the second dataset as a single consistent volume.

14 Claims, 6 Drawing Sheets

(56) References Cited

OTHER PUBLICATIONS

Natsuaki, Y., et al. "Time-of-flight with sparse undersampling (TOFu): towards practical MR applications of the compressed sensing." Proceedings of the 22nd Annual Meeting of ISMRM, Milan, Italy. 2014.*
Parker, D. L., Yuan, C., & Blatter, D. D. (1991). MR angiography by multiple thin slab 3D acquisition. Magnetic Resonance in Medicine, 17(2), 434-451.
Natsuaki, et al., "Time-of-Flight with Sparse undersampling (TOFu): towards practical MR applications of the Compressed Sensing" Proc. Intl. Soc. Mag. Reson. Med. 22 (2014) 0941.

* cited by examiner

NON-CONTRAST MR ANGIOGRAPHY WITH VARIABLE SLICE RESOLUTION 3D TIME-OF-FLIGHT

TECHNOLOGY FIELD

The present invention relates generally to methods, systems, and apparatuses for Variable Slice Resolution Time of Flight Magnetic Resonance Angiography. The disclosed technology may be applied to adjust slice resolutions according to anatomical needs for optimizing minimum scan time, larger slice field of view coverage, and improved overall image quality.

BACKGROUND

Multiple Overlapping Thin Slab Acquisition (MOTSA) is a Magnetic Resonance Imaging (MRI) acquisition technique, wherein several overlapping 3D volumes (or "slabs") are sequentially acquired and combined into a single 3D volume. MOTSA is used for 3D time-of-flight (TOF) MRI intracranial angiography applications, where flow compensated gradient-echo sequences are optimized to favor the vascular signal over that of the surrounding tissues.

In practice, 3D TOF sequences with MOTSA are limited to small slice field of view (FOV) coverage and to low slice resolution in order to keep the scan time clinically relevant (<10 min). The recent developments in MRI acceleration techniques such as the sparse undersampling and iterative reconstruction on TOF (e.g., TOF with sparse undersampling) can provide much needed extra scan time savings that enables larger slice FOV acquisition within acceptable scan time, and thus can potentially overcome the slice FOV coverage limitation of the conventional TOF.

In the prior systems and in the conventional TOF, every overlapping slab is a slice-shifted copy of itself with identical parameters by default. With this, the scan time savings from the advanced MM acceleration techniques can only be utilized toward more slice FOV coverage or remain as is (i.e., keeping the time savings). In reality, though, not all blood vessels are constructed equally, and slice resolution in each of the overlapped slabs should be tailored accordingly. For example, for some applications, more slice resolution may be needed for smaller distal arteries and less may be required for larger, well-defined vessels.

SUMMARY

Embodiments of the present invention address and overcome one or more of the above shortcomings and drawbacks, by providing methods, systems, and apparatuses related to a non-contrast Magnetic Resonance (MR) angiography with variable slice resolution 3D TOF. Briefly, slice resolutions are adjusted for individual portions of an anatomical area of interest to help minimize scan time, produce larger slice field of view coverage, and improve overall image quality.

According to some embodiments, a method for acquiring an image volume using a magnetic resonance imaging device includes performing an acquisition process to acquire a first dataset corresponding to a first portion of an anatomical region of interest at a first slice resolution (e.g., 100 slice resolution). Additionally, one or more additional acquisition processes is performed to acquire a second dataset corresponding to a second portion of the anatomical region of interest at a second slice resolution that is lower or higher than the first slice resolution (e.g., 50% slice resolution). Each dataset comprises a plurality of three-dimensional slabs or a plurality of two-dimensional slice regions. In some embodiments, the acquisition processes each perform incoherent undersampling of the anatomical region of interest along a slab direction. In some embodiments, the acquisition processes each employ an accelerated 3D Time-of-Flight (TOF) sampling strategy, for example, using a variable density spiral phyllotaxis, or variable density Poisson patterns in ky-kz phase-encoding directions. Once the datasets are acquired, a reconstruction process is applied to jointly reconstruct the first dataset and the second dataset as a single consistent volume.

In some embodiments of the aforementioned method, the anatomical region of interest is divided into the first portion and the second portion based on one or more anatomical features of the anatomical region of interest. For example, in one embodiment, these anatomical features comprise vessels and the anatomical region of interest is divided into the first portion and the second portion based on vessel size. Thus, the first portion may correspond to a superior head-neck anatomical region and the second portion may correspond to an inferior head-neck region.

According to other embodiments, an article of manufacture for acquiring an image volume using a magnetic resonance imaging device comprises a non-transitory, tangible computer-readable medium holding computer-executable instructions for performing a method which includes receiving two data sets. The first dataset corresponds to a first portion of an anatomical region of interest and comprises a first plurality of three-dimensional slabs or a first plurality of two-dimensional slice regions acquired by an acquisition process at a first slice resolution. The second dataset corresponds to a second portion of the anatomical region of interest and comprises a second plurality of three-dimensional slabs or a second plurality of two-dimensional slice regions acquired by one or more additional acquisition processes at a second slice resolution that is lower or higher than the first slice resolution. Each portion of the anatomical region of interest may be selected automatically or based on some user input. For example, in one embodiment, user identification of the first portion of the anatomical region of interest is received via a graphical user interface (GUI). The method further includes applying a reconstruction process to jointly reconstruct the first dataset and the second dataset as a single consistent volume.

According to other embodiments, a system for acquiring an image volume using a magnetic resonance imaging device comprises an imaging device and a central control computer unit. The imaging device comprises coils which are configured to (i) acquire a first dataset corresponding to a first portion of an anatomical region of interest at a first slice resolution, wherein the first dataset comprises a first plurality of three-dimensional slabs or a first plurality of two-dimensional slice regions and (ii) acquire a second dataset corresponding to a second portion of the anatomical region of interest at a second slice resolution that is lower or higher than the first slice resolution, wherein the second dataset comprises a second plurality of three-dimensional slabs or a second plurality of two-dimensional slice regions. The central control computer unit is configured to apply a reconstruction process to jointly reconstruct the first dataset and the second dataset as a single consistent volume. In some embodiments, the central control computer unit is further configured to divide the anatomical region of interest into the first portion and the second portion based on one or more anatomical features of the anatomical region of interest. For example, in one embodiment, the anatomical features comprise vessels and the anatomical region of interest is divided into the first portion and the second portion based on vessel size.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses for performing non-contrast Magnetic Resonance (MR) angiography with variable slice resolution 3D TOF acquisitions. More specifically, the technology described herein acquires TOF slabs at variable slice resolution according to anatomical needs, while enabling seamless merging into one continuous volume. This technology allows scan time savings to be re-invested optimally in order to maximize the slice FOV coverage and to improve slice resolution where needed.

Figure 1:
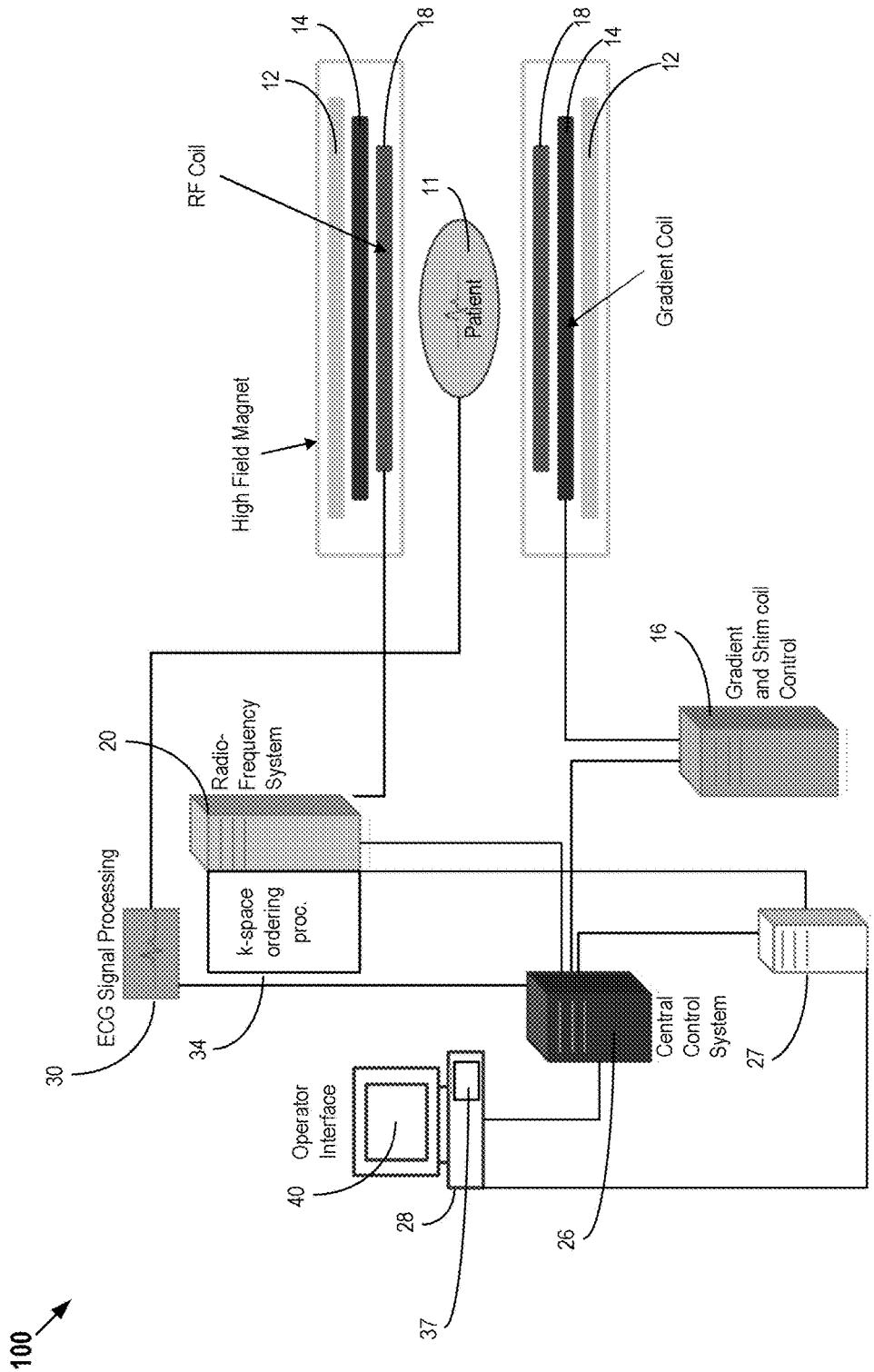
FIG. 1 shows a system for ordering acquisition of frequency domain components representing magnetic resonance (MR) image data for storage in a k-space storage array, as used by some embodiments of the present invention.

FIG. 1 shows a system 100 for ordering acquisition of frequency domain components representing MR image data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control unit 26 directs the various components of the system 100 to acquire radial k-space data using a bSSFP sequence with an interleaved-angle asymmetric radial sampling scheme.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. Electrocardiogram (ECG) synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

Using techniques described herein, the system 100 illustrated in FIG. 1 may be applied to perform imaging using variable slice resolution 3D TOF acquisition techniques. Thus, using the disclosed techniques, a region of interest can be divided into two or more portions. Then, each portion can be acquired at different slice resolutions before merging the acquired data into a single volume. In a conventional TOF acquisition, multiple overlapped slabs in axial in-plane orientation with identical voxel sizes are merged into one large volume. For the axial in-plane view, the resolution must be kept through the entire merged volume for consistency in the Digital Imaging and Communications in Medicine (DICOM) source image format. Slice direction, on the other hand, is utilized only in the Maximum Intensity Projections (MIP), and by interpolation, variable slice resolution still suffices the merging requirement in the slice voxel size. With larger slice FOV coverage, not every location within the FOV has the same slice resolution needs, and this can be further exploited with the variable slice resolution in each slab.

Figure 2:
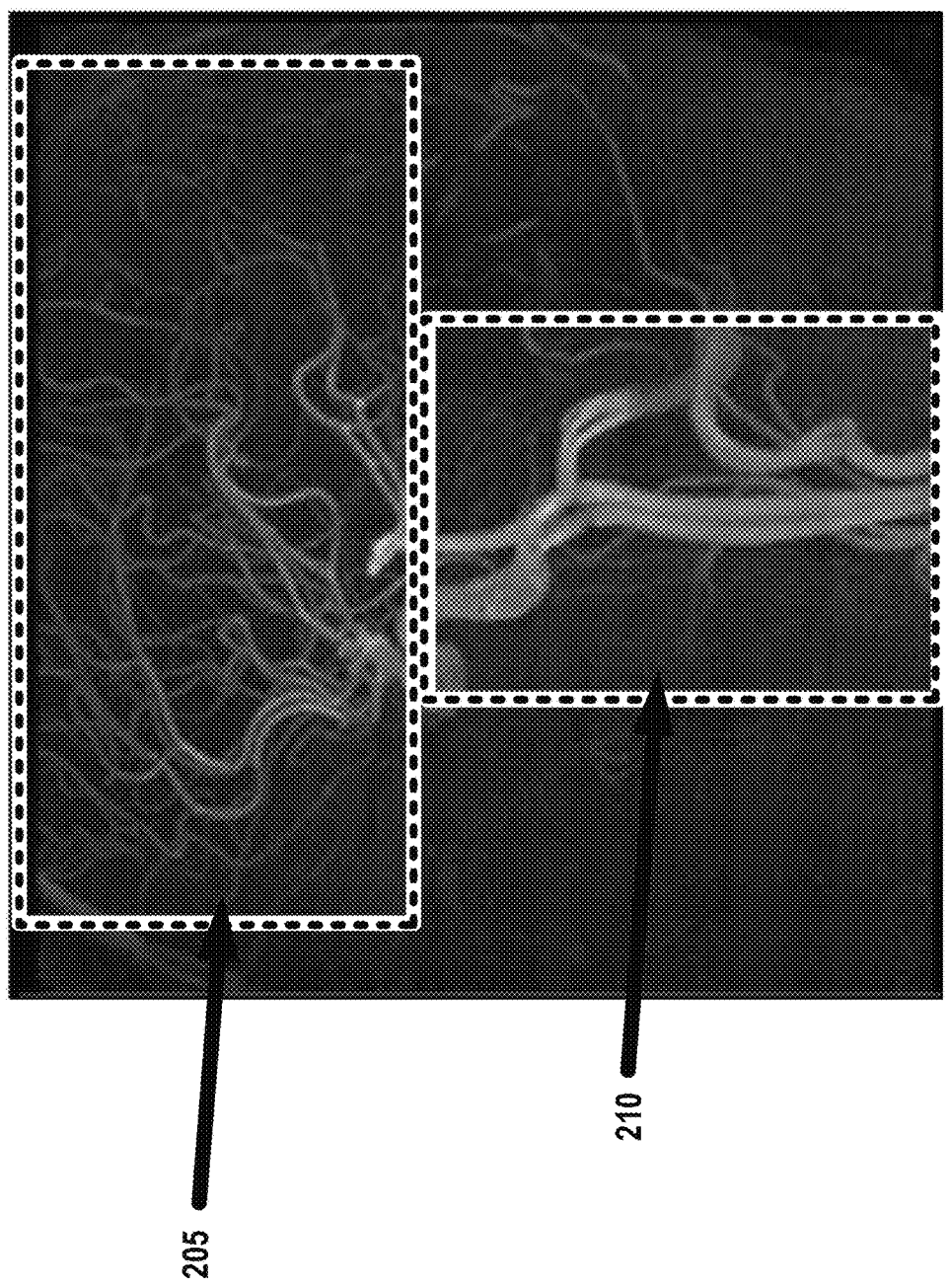
FIG. 2 provides a representative example of intracranial TOF MR angiography of large slice coverage, reformatted to a sagittal maximum intensity projection (MIP)

FIG. 2 provides a representative example of intracranial TOF MR angiography of large slice coverage, reformatted to sagittal MIP, to demonstrate that not all blood vessels are built equal. In this example, superior blood vessels (box 205) show smaller arteries with tortuous inflow, thus higher slice resolution is desirable. Inferior blood vessels (box 210), on the other hand, are large carotid arteries with well-defined inflow. For the inferior blood vessels, imaging can be performed with lower slice resolution and still obtain high quality data.

Figure 3:
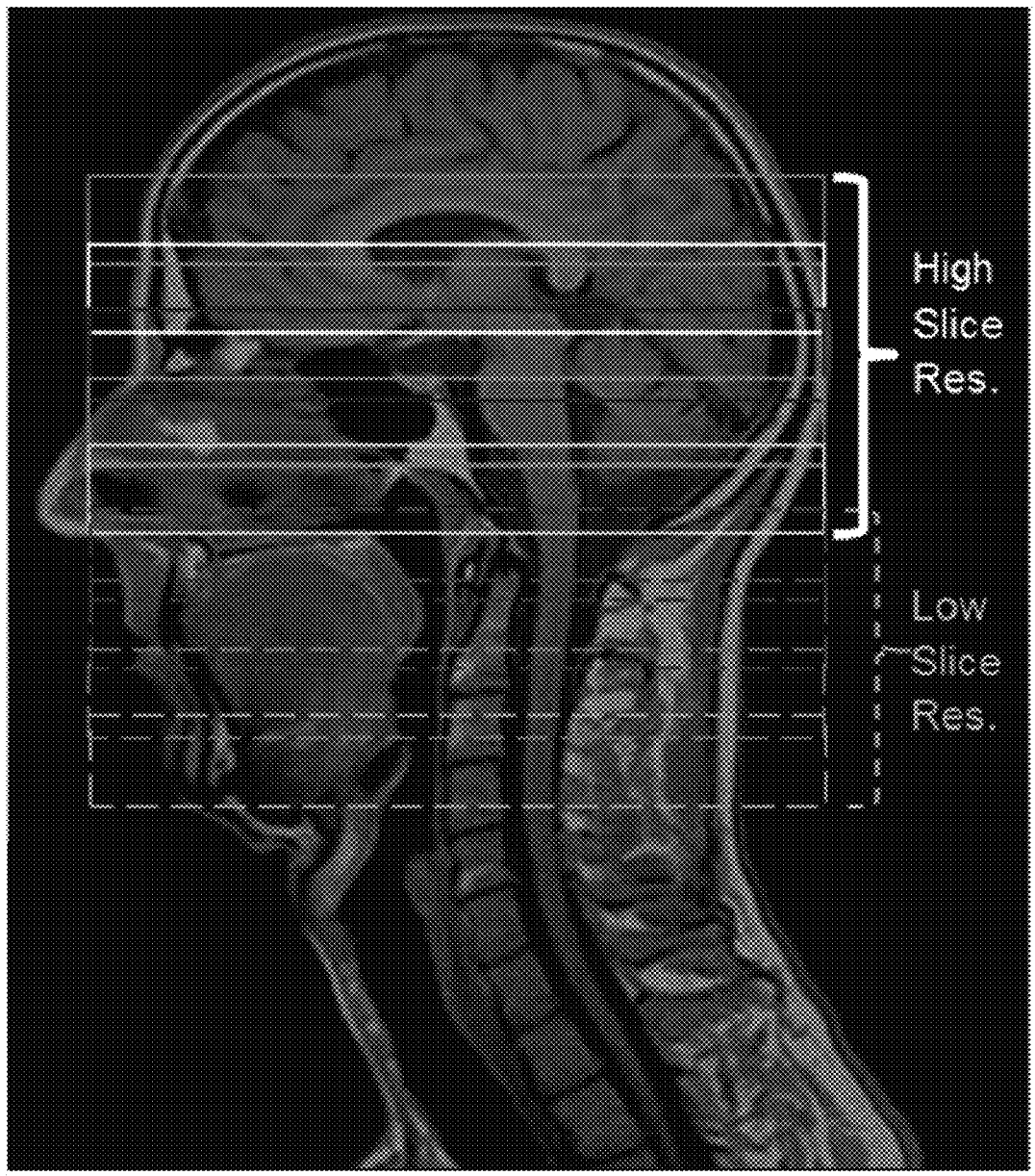
FIG. 3 shows a schematic diagram of large slice FOV variable slice resolution TOF, according to some embodiments.

FIG. 3 shows a schematic diagram of large slice FOV variable slice resolution TOF, according to some embodiments. The example of FIG. 3 is prescribed for a brain-neck application. Based on anatomical needs, superior 5 slabs are acquired with high slice resolution and inferior 4 slabs are acquired with low slice resolution.

Figure 4:
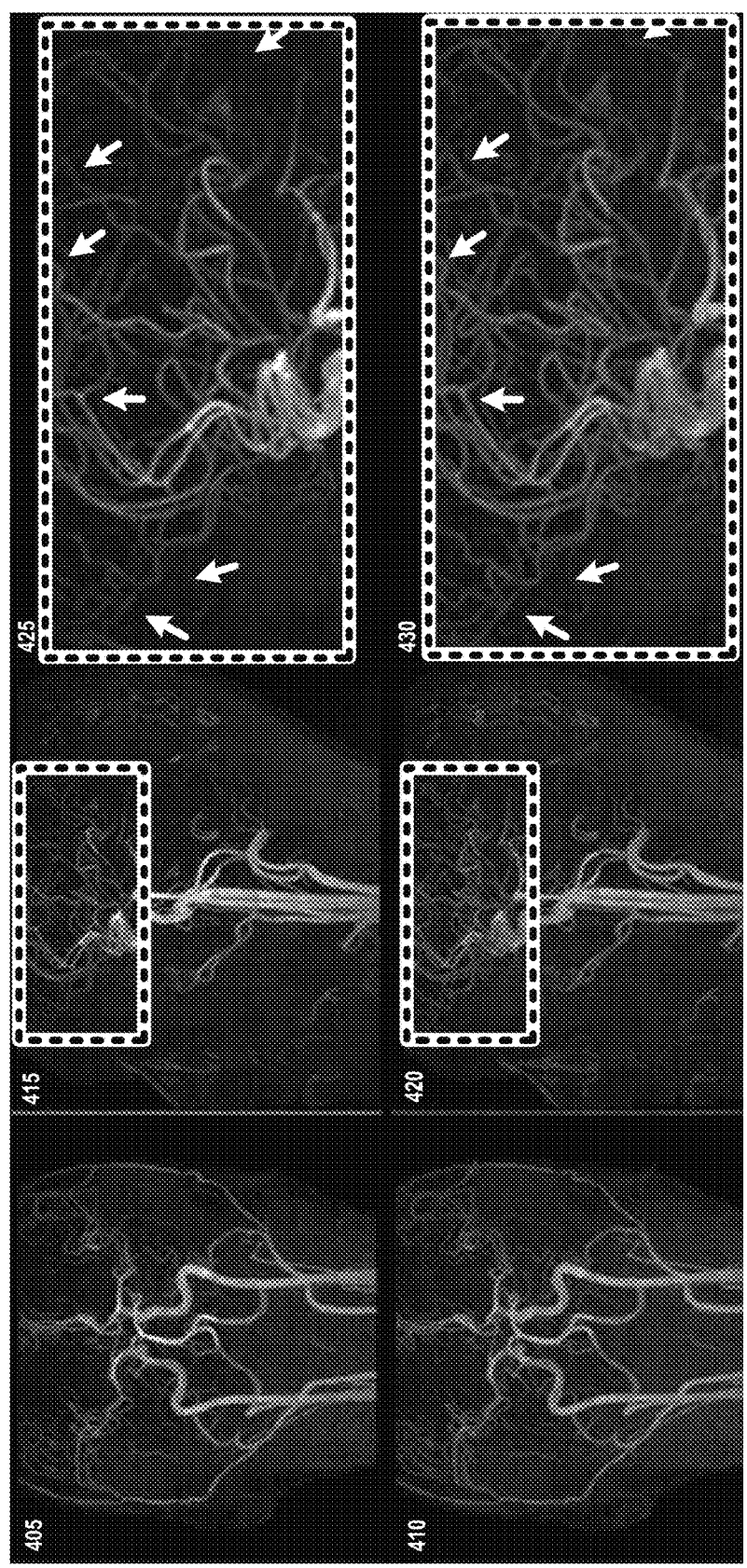
FIG. 4 provides a set of MIPs of large FOV TOF data sets comparing traditional techniques to the techniques described herein.

FIG. 4 provides a set of maximum intensity projections (MIPs) of large FOV TOF data sets comparing traditional techniques to the techniques described herein. Images 405 and 410 represent coronal acquisitions, images 415 and 420 represent sagittal acquisitions, and images 425 and 430 represent zoomed sagittal acquisitions The upper row of FIG. 4 (images 405, 415, and 425) represents standard low slice resolution TOF and the lower row (images 410, 420, and 430) depicts the variable slice resolution according to the techniques described herein. For the variable slice resolution TOF, top 5 slabs were acquired with high slice resolution (100%) to better delineate smaller vessels (see the arrows in image 430 vs arrows in image 425). The bottom 4 slabs were able to be acquired with lower slice resolution (50%) since intended vessel in carotids are well-defined.

Figure 5:
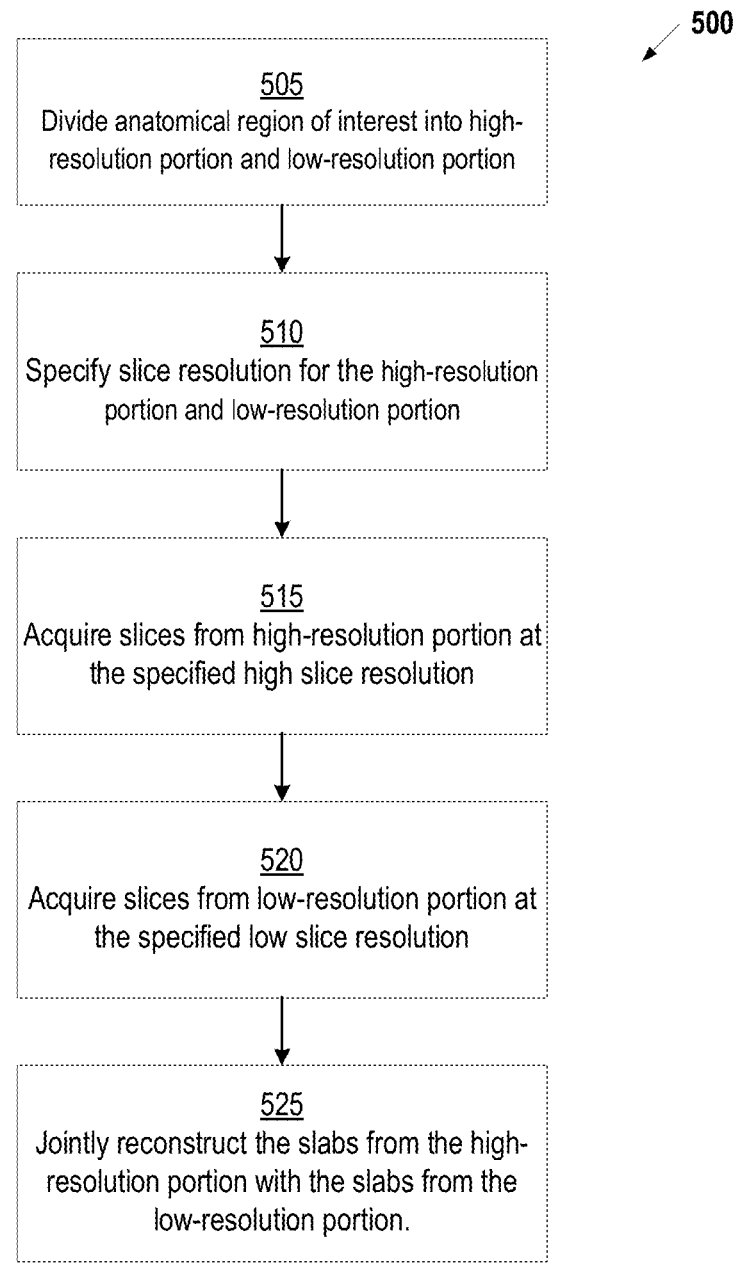
FIG. 5 provides an illustration of a process for performing variable slice resolution imaging, according to some of the embodiments described herein.

FIG. 5 provides an illustration of a process 500 for performing variable slice resolution imaging, according to some of the embodiments described herein. It should be noted that, although the processes only mention a 3D dataset, the same concept is equally applicable to 2D datasets (i.e., comprising two-dimensional slice regions). At step 505, a volume comprising the anatomical region of interest in divided into a high-resolution portion and a low-resolution portion based on one or more anatomical features in the region. For example, in angiography applications, the regions of interest may be divided such that a high-resolution portion covers smaller vessels in the region of interest, while the low-resolution portion covers the remaining, larger vessels in the region of interest. This division may be automatic, for example, based on a priori information about the anatomy such as previously acquired images, family history data, or general knowledge of the typical features present in the anatomy. In some embodiments, an interactive graphical user interface is employed wherein a user can select a particular region of the anatomy as the high-resolution portion (e.g., by clicking and dragging a box over a representation of the anatomy or by providing coordinates of the desired region).

Next, at step 510, the slice resolution for the high-resolution and low-resolution portion is specified. In general, the high-resolution is acquired at 100% resolution. The low-resolution portion is then acquired at slice resolution less than 100%. The degree to which the lower resolution is below 100% can vary based on factors such as the desired scan time and the anatomical features being imaged in the lower portion; however, in general, any resolution less than 100% may be used. For example, in one embodiment, the low resolution is 50% relative to full slice resolution.

Continuing with reference to FIG. 5, at step 515, an imaging device (see, e.g., FIG. 1) performs a multi-slab acquisition process to acquire a plurality of slabs in the high-resolution portion at the high resolution determined at step 510. Similarly, at step 520, the imaging device performs a second multi-slab acquisition process to acquire a second plurality of slabs in the low-resolution portion at the low resolution determined at step 510. Various techniques known in the art may be used to perform the acquisition. In some embodiments, compressed sensing reconstruction is applied to the slabs and incoherent sampling may be used to achieve high acceleration factors during the acquisition process. Various techniques may be used to increase the incoherence of the sampled data. For example, in some embodiments, variable density sampling trajectories (e.g., using spiral phyllotaxis or variable density Poisson patterns) may be used to ensure that the slabs are incoherent by increasing the size of the acquisition matrix. As the sample size is increased, incoherence is asymptotically increased and, in turn, the reconstructed image quality may be improved. One example of a technique for increasing the acquisition matrix to produce incoherence may be found in U.S. patent application Ser. No. 14/515,714, filed Oct. 16, 2014 and incorporated herein by reference. Additionally, the multi-slab acquisition process may be tailored to the clinical application. For example, in some embodiments, the multi-slab acquisition process employs an accelerated 3D TOF sampling strategy for an angiography application.

Returning to FIG. 5, at step 525, an iterative compressed-sensing reconstruction process is applied to jointly reconstruct the slabs from the high-resolution portion with the slabs from the low-resolution portion. In general, any techniques generally known in the art may be used for performing reconstruction of the slabs. For example, in some embodiments, the iterative compressed-sensing reconstruction process solves a cost function comprising a summation of individual data fidelity terms corresponding to the plurality of three-dimensional slabs. Once reconstructed, the data may be used to generate 2D MIP images by selecting the maximum value through the reconstructed data "seen" by each 2D pixel at each of several viewing angles. Techniques for generating MIPs are generally known in the art and, thus, not described here in detail. Briefly, the voxels with maximum intensity that intersect with parallel rays traced from the viewpoint to the plane of projection are identified and projected onto the visualization plane.

Figure 6:
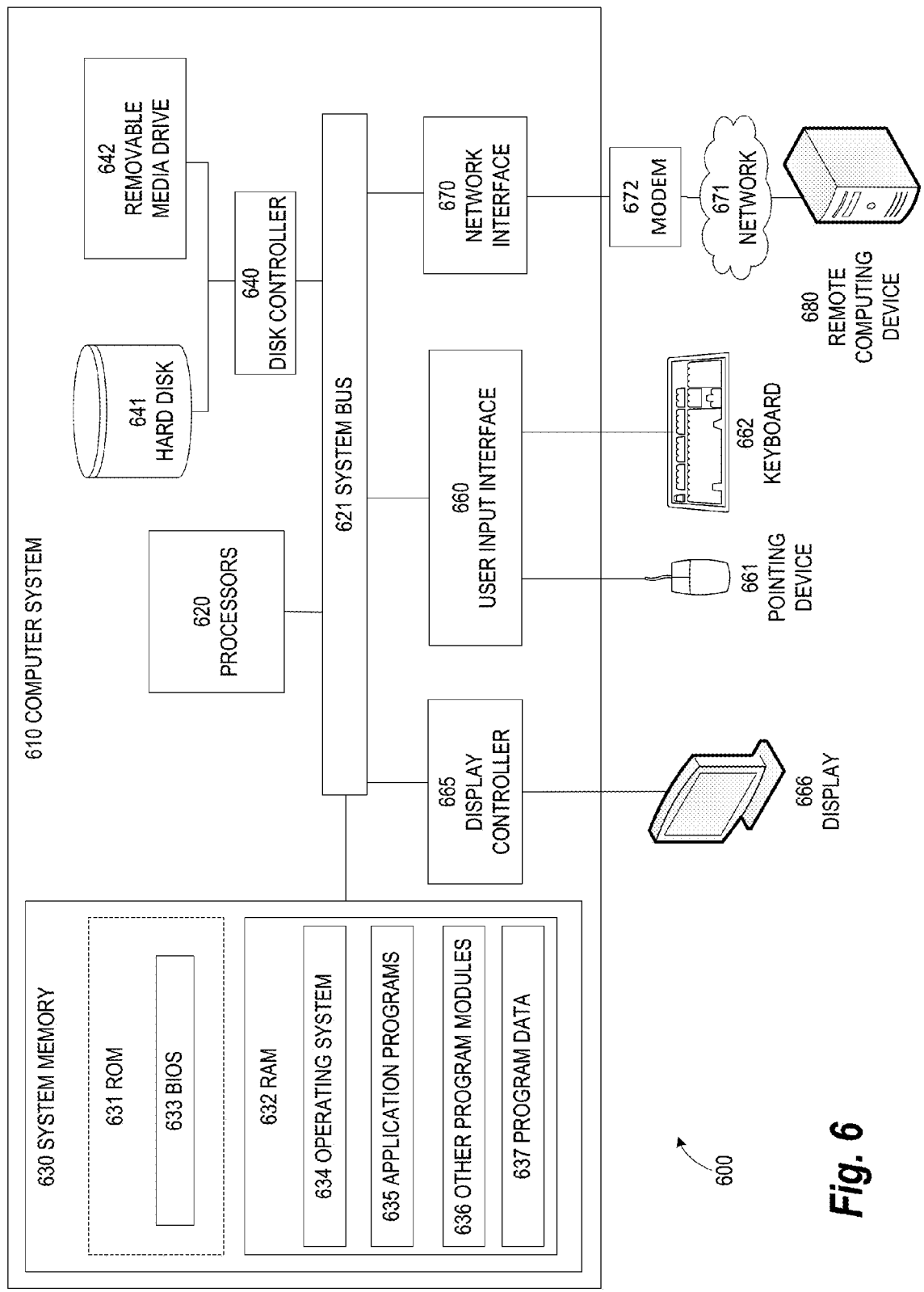
FIG. 6 illustrates an exemplary computing environment within which embodiments of the invention may be implemented.

FIG. 6 illustrates an exemplary computing environment 600 within which embodiments of the invention may be implemented. For example, this computing environment 600 may be used to implement the process 500 of joint reconstruction of three-dimensional slabs described in FIG. 5. In some embodiments, the computing environment 600 may be used to implement one or more of the components illustrated in system 100 of FIG. 1. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet.

Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for.

We claim:

1. A method for acquiring an image volume using a magnetic resonance imaging device, the method comprising:
   dividing an anatomical region of interest into a first portion and a second portion based on one or more anatomical features of the anatomical region of interest, wherein (i) the first portion and the second portion cover separate areas of the anatomical region of interest; (ii) the anatomical features comprise vessels; and (iii) the anatomical region of interest is divided based on vessel size such that the vessels in the first portion are larger than the vessels in the second portion;
   performing an acquisition process to acquire a first dataset corresponding to the first portion of the anatomical region of interest at a first slice resolution, wherein the first dataset comprises a first plurality of three-dimensional slabs or a first plurality of two-dimensional slice regions;
   performing one or more additional acquisition processes to acquire a second dataset corresponding to the second portion of the anatomical region of interest at a second slice resolution that is lower or higher than the first slice resolution, wherein the second dataset comprises a second plurality of three-dimensional slabs or a second plurality of two-dimensional slice regions; and
   applying a reconstruction process to jointly reconstruct the first dataset and the second dataset as a single consistent volume.

2. The method of claim 1, wherein the first portion corresponds to a superior head-neck anatomical region and the second portion corresponds to an inferior head-neck region.

3. The method of claim 1, wherein the first slice resolution is 100% slice resolution.

4. The method of claim 3, wherein the second slice resolution is 50% slice resolution.

5. The method of claim 1, wherein the acquisition process and the one or more additional acquisition processes each perform incoherent undersampling of the anatomical region of interest along a slab direction.

6. The method of claim 1, wherein the acquisition process and the one or more additional acquisition processes each employ an accelerated 3D Time-of-Flight (TOF) sampling strategy.

7. The method of claim 6, wherein the accelerated 3D TOF sampling strategy employs variable density spiral phyllotaxis, or variable density Poisson patterns in ky-kz phase-encoding directions.

8. An article of manufacture for acquiring an image volume using a magnetic resonance imaging device, the article of manufacture comprising a non-transitory, tangible computer-readable medium holding computer-executable instructions for performing a method comprising:
dividing an anatomical region of interest into a first portion and a second portion based on one or more anatomical features of the anatomical region of interest, wherein (i) the first portion and the second portion cover separate areas of the anatomical region of interest; (ii) the anatomical features comprise vessels; and (iii) the anatomical region of interest is divided based on vessel size such that the vessels in the first portion are larger than the vessels in the second portion;
receiving a first dataset corresponding to the first portion of the anatomical region of interest, wherein the first dataset comprises a first plurality of three-dimensional slabs or a first plurality of two-dimensional slice regions acquired by an acquisition process at a first slice resolution;
receiving a second dataset corresponding to the second portion of the anatomical region of interest, wherein the second dataset comprises a second plurality of three-dimensional slabs or a second plurality of two-dimensional slice regions acquired by one or more additional acquisition processes at a second slice resolution that is lower or higher than the first slice resolution; and
applying a reconstruction process to jointly reconstruct the first dataset and the second dataset as a single consistent volume.

9. The article of manufacture of claim 8 wherein the first portion corresponds to a superior head-neck anatomical region and the second portion corresponds to an inferior head-neck region.

10. The article of manufacture of claim 8, wherein the method further comprises:
receiving a user identification of the first portion of the anatomical region of interest via a graphical user interface (GUI).

11. The article of manufacture of claim 8, wherein the acquisition process and the one or more additional acquisition processes each perform incoherent undersampling of the anatomical region of interest along a slab direction.

12. The article of manufacture of claim 8, wherein the acquisition process and the one or more additional acquisition processes each employ an accelerated 3D Time-of-Flight (TOF) sampling strategy.

13. The article of manufacture of claim 12, wherein the accelerated 3D TOF sampling strategy employs variable density spiral phyllotaxis, or variable density Poisson patterns in ky-kz phase-encoding directions.

14. A system for acquiring an image volume using a magnetic resonance imaging device, the system comprising:
an imaging device comprising a plurality of coils configured to:
divide an anatomical region of interest into a first portion and a second portion based on one or more anatomical features of the anatomical region of interest, wherein (i) the first portion and the second portion cover separate areas of the anatomical region of interest; (ii) the anatomical features comprise vessels; and (iii) the anatomical region of interest is divided based on vessel size such that the vessels in the first portion are larger than the vessels in the second portion;
acquire a first dataset corresponding to the first portion of the anatomical region of interest at a first slice resolution, wherein the first dataset comprises a first plurality of three-dimensional slabs or a first plurality of two-dimensional slice regions;
acquire a second dataset corresponding to the second portion of the anatomical region of interest at a second slice resolution that is lower or higher than the first slice resolution, wherein the second dataset comprises a second plurality of three-dimensional slabs or a second plurality of two-dimensional slice regions; and
a central control computer unit configured to apply a reconstruction process to jointly reconstruct the first dataset and the second dataset as a single consistent volume.

* * * * *